United States Patent

Snyder et al.

Patent Number: 5,625,288
Date of Patent: Apr. 29, 1997

[54] ON-CLIP HIGH FREQUENCY RELIABILITY AND FAILURE TEST STRUCTURES

[75] Inventors: Eric S. Snyder; David V. Campbell, both of Albuquerque, N.M.

[73] Assignee: Sandia Corporation, Albuquerque, N.M.

[21] Appl. No.: 590,690

[22] Filed: Jan. 16, 1996

Related U.S. Application Data

[63] Continuation of Ser. No. 141,834, Oct. 22, 1993, abandoned.

[51] Int. Cl.[6] ............................................. G01R 15/12
[52] U.S. Cl. ..................... 324/158.1; 324/73.1; 324/763
[58] Field of Search ........................... 324/703, 73.1, 324/158.1, 765, 760, 763; 437/8; 371/22.1, 22.6, 15.1, 22.5, 25.1, 16.1; 368/118, 120

[56] References Cited

U.S. PATENT DOCUMENTS

| | | | |
|---|---|---|---|
| 4,483,629 | 11/1984 | Schwarz et al. | 374/57 |
| 4,739,258 | 4/1988 | Schwarz | 324/703 |
| 4,918,385 | 4/1990 | Shreeve | 371/22.6 |
| 5,057,441 | 10/1991 | Gutt et al. | 437/8 |
| 5,099,196 | 3/1992 | Longwell et al. | 324/73.1 |
| 5,202,626 | 4/1993 | Pham et al. | 324/73.1 |
| 5,233,161 | 8/1993 | Farwell et al. | 324/158.1 |
| 5,294,882 | 3/1994 | Tanaka | 324/73.1 |
| 5,381,087 | 1/1995 | Hirano | 324/73.1 |

Primary Examiner—Vinh P. Nguyen
Attorney, Agent, or Firm—Gregory A. Cone

[57] ABSTRACT

Self-stressing test structures for realistic high frequency reliability characterizations. An on-chip high frequency oscillator, controlled by DC signals from off-chip, provides a range of high frequency pulses to test structures. The test structures provide information with regard to a variety of reliability failure mechanisms, including hot-carriers, electromigration, and oxide breakdown. The system is normally integrated at the wafer level to predict the failure mechanisms of the production integrated circuits on the same wafer.

22 Claims, 13 Drawing Sheets

ON-CLIP HIGH FREQUENCY RELIABILITY AND FAILURE TEST STRUCTURES

The government has rights to this invention pursuant to Contract No. DE-AC04-76PD00789 awarded by the U.S. Department of Energy.

This is a continuation of application Ser. No. 08/141,834 filed on Oct. 22, 1993, now abandoned.

BACKGROUND OF THE INVENTION

This invention relates to wafer-level reliability testing of semiconductor integrated circuit structures at high frequencies. More particularly, such testing is accomplished by generating the high frequencies on-chip to drive the test structures. The frequency and duty cycle of the pulses from the on-chip oscillator are controlled by off-chip DC signals.

As integrated circuits (ICs) continue to be designed with smaller and smaller dimensions, clock speeds continue to rise. CMOS microprocessors operating at more than 200 MHz have been announced. However, typical reliability assessments are based on applying DC and low frequency AC signals to test structures. Since reliability at high frequencies can be different than the results at DC, actual circuit reliability may be severely over or under estimated if high frequency (HF) effects are not considered.

For hot-carrier-induced degradation of MOSFETs, many different AC stress results have been reported. Compared with DC stress where there is little controversy, AC stress results at various laboratories are contradictory. Furthermore, a simple DC stress may not represent the worst-case stress. Alternating injection of holes and the subsequent trapping of electrons can result in additional damage. Mechanical stress has also been shown to enhance AC damage. Other "enhancements" during AC stress have been attributed to instrumentation issues associated with applying HF signals. These contradictory results may also be due, in part, to differences in technology. For electromigration, DC stress is the worst-case stress. A bipolar AC electromigration stress can result in an average failure time that is 1,000 times longer. This amount of "margin" is significant and must be verified for a given technology. For oxide breakdown, an increase in average failure time has been observed under both bipolar and unipolar AC stress. Therefore, it is important to study and characterize these AC reliability effects.

Most AC reliability studies are performed at low frequencies (below 10 MHz). However, today's ICs operate at much faster clock rates. Since most reliability-test systems are DC (or low frequency AC), examining reliability at high frequencies normally requires new and expensive test systems. Studying the reliability over the complete military temperature range (−55° C. to 125° C.) adds additional complexity.

SUMMARY OF THE INVENTION

To improve the study of HF reliability effects, we designed and built a series of HF test structures for various failure mechanisms that require only DC stimulus. These self-stressing structures generate HF stress-signals on-chip and provide unique advantages for performing HF characterizations. First, existing DC wafer-level and packaged-part test systems can be used. This results in a significant cost savings compared to the cost of a dedicated HF test system. If the DC test system can control the temperature, these structures can also be used to examine AC effects at various temperatures. Furthermore, the achievable stress frequencies and rise/fall times typify the technology since the excitation source and circuit elements are on-chip. The structures are also easy to adapt to existing standard CMOS processes; we have built functioning structures at four different fabrication facilities. As a result, these structures provide a simple method to calibrate reliability simulators and characterize HF reliability effects.

BRIEF DESCRIPTION OF THE DRAWINGS

FIG. 7b is a graph showing simulated waveforms during stress of the structure of FIG. 7a.

FIG. 8 is a graph showing the evolution of HF-induced degradation in the inverter of FIG. 7a.

FIG. 10 is a graph showing the comparison between AC and DC stress lifetimes in the n-channel transistors in the inverter of FIG. 7a.

FIG. 11 is a graph showing the variation with temperature in HF hot carrier degradation for the transistors in the inverter in FIG. 7a.

DETAILED DESCRIPTION OF THE INVENTION

The self-stressing test structures normally will have at least two elements, the high frequency oscillator and the device under test. Most of the test structures will also include a buffer circuit to control signals, a heater to accelerate the failure mechanisms, and a temperature sensor. Three different high frequency oscillators are described, two current controlled and one voltage controlled. Depending upon feature sizes and circuit design, these oscillators can operate at frequencies above 500 MHz, needing only DC control signals from off the chip. Temperature sensor and heater elements on the structures are also described. Although only three failure mechanisms are investigated herein, others can also be pursued and are within the ordinary skill in the art. A variety of devices can be used to test for these failure mechanisms, and the scope of this invention should not be limited only to those described in detail herein.

The first set of experimental results is produced from using these test structures for HF hot-carrier characterization. A quasi-static model explains the results for frequencies from 1 MHz to 230 MHz and temperatures from −65° C. to 190° C. Another set of experiments describe the performance of the electromigration and oxide breakdown test structures.

The core of the test structure is a DC-controlled HF oscillator. Externally supplied DC currents (or voltages) control the frequency and duty cycle of the pulses. Examples of current-controlled oscillators and voltage-controlled oscillators will be discussed below. The HF signal generated by the oscillator is routed to various circuit elements. These circuit elements can include an inverter (for hot-carriers), metal lines (for electromigration) and capacitors (for oxide breakdown). Other elements such as NOR and NAND gates or analog circuit elements can also be used. The HF stress signal can be electronically isolated which allows DC measurement of the circuit elements.

Figure 19:
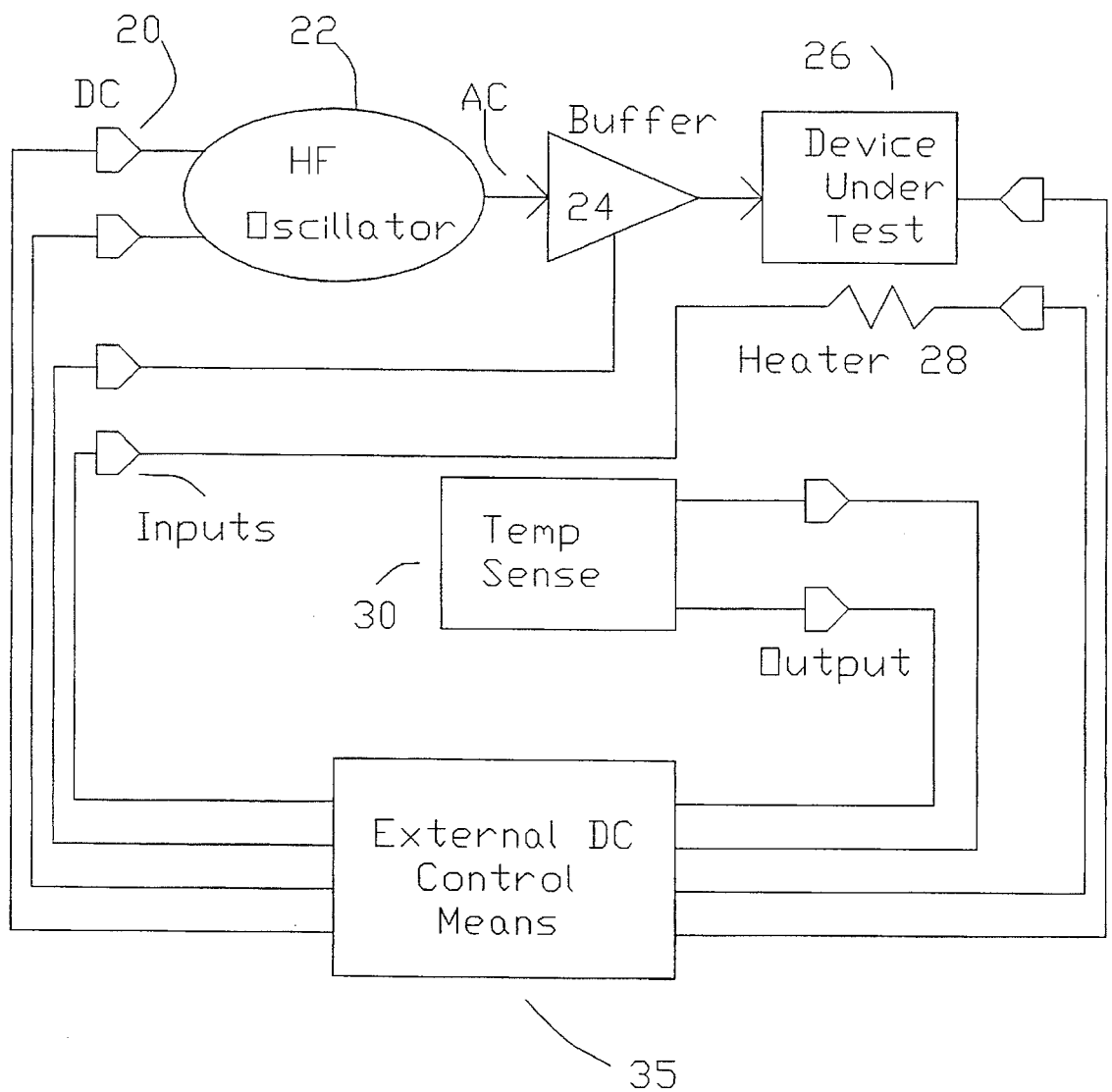
FIG. 19 is a schematic diagram of the basic organization of the system of this invention showing the input DC control signals, the on-chip HF oscillator, the buffer, the device under test, the heater, and the temperature sensing means and the external DC control means 35, the external control means having a preferred embodiment as a parametric test system as discussed below.

FIG. 19 is a schematic diagram of the system level organization of the invention herein and is a more generalized version of FIGS. 6 and 12 discussed below. Control of the high frequency oscillator 22, the buffer 24, the device under test (DUT) 26, and the heater 28 is done via the DC input control lines 20 which are connected to an external DC control means. The oscillator 22 may be implemented as either a current-controlled or a voltage-controlled oscillator as described more fully below. The device under test 26, described in the claims appended hereto as test structure means, may comprise any one or combinations of various devices, i.e., capacitors, MOS transistors, bipolar transistors, conductors or other electronic elements capable of being fabricated on the chip.

DC-Controlled Oscillator

Figure 1:
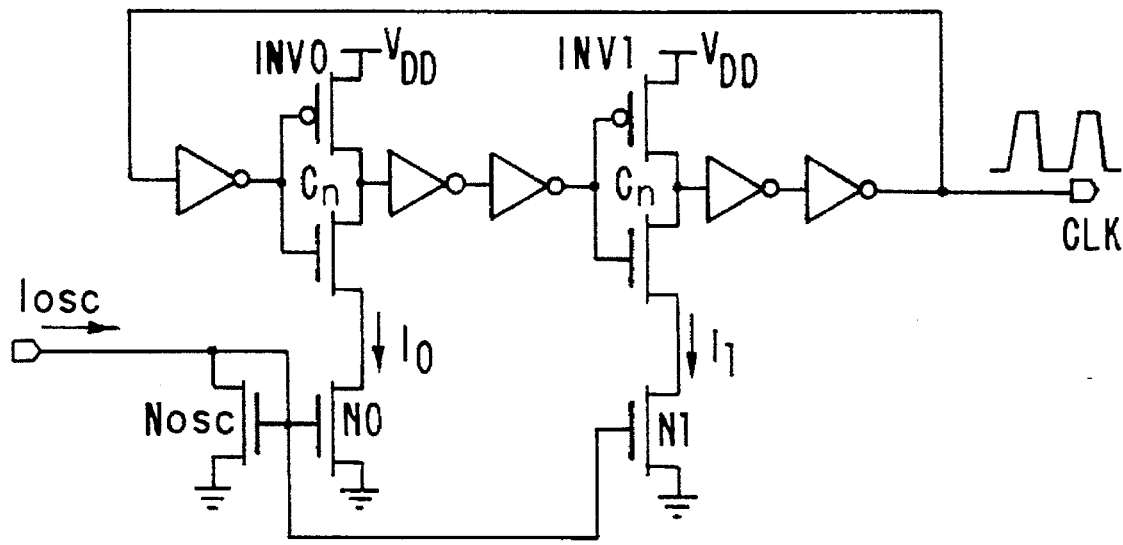
FIG. 1 is a schematic diagram of a current-controlled oscillator.

A key element of the self-stressing test structures is a stable, current-controlled oscillator (ICO) with a wide frequency range. FIG. 1 defines the oscillator for a digital CMOS process. The output is a time varying voltage at CLK. This oscillator is a modified ring oscillator, with current mirrors inserted in series with the inverters INV0 and INV1. The n-channel transistors Nosc, N0 and N1 ($I_0$ and $I_1$) are directly related to $I_{osc}$. If the width (W) and the length (L) of Nosc, N0 and N1 are the same, the currents $I_{osc}$, $I_0$ and $I_1$ are the same. With a "1" at the input of INV0, the p-channel device is "off" and the n-channel device is "on." The n-channel device removes the charge on $C_N$, where $C_N$ is the effective output capacitances seen by inverter INV0 (and INV1). Since $I_0$ is the current available to discharge $C_N$, the time required to discharge this node is approximately $\tau_{p0}=CN(V_{DD}-V_{TH})/I_0$, where $V_{TH}$ is the voltage necessary for the next inverter to switch. For a symmetrically designed CMOS inverter, $V_{TH}$ is $V_{DD}/2$. Similarly, the current $I_1$ controls the propagation time of a logic "1" ($\tau_{p1}$). $\tau_{p1}$ is approximately $C_N(V_{DD}-V_{TH})/I_1$. If $I_0$ and $I_1$ are reduced by reducing $I_{osc}$, $\tau_{p0}$ and $\tau_{p1}$ are increased, which in-turn reduces the frequency. Similarly, the frequency can be increased by increasing $I_{osc}$.

A simple model for the frequency dependence of the current-controlled oscillator in FIG. 1 is $$1/f=\tau_{p0}+\tau_{p1}+2\cdot N\cdot\tau_p(V_{DD}),$$

where f is the frequency of oscillation, N is the number inverter stages and $\tau_p$ is the intrinsic propagation delay of an inverter. $\tau_{p0}$ and $\tau_{p1}$ control the frequency for low current values. The last term represents the intrinsic propagation of the inverters, which limits the maximum oscillator frequency. This maximum frequency increases with larger $V_{DD}$ and for smaller geometry technologies because $\tau_p$ is smaller. For a simple design with $I_{osc}=I_0=I_1$, simplifies to $$\frac{1}{f} = \frac{2\cdot C_N\cdot(V_{DD}-V_{TH})}{I_{osc}} + 2\cdot N\cdot\tau_P(V_{DD}).$$

Figure 2:
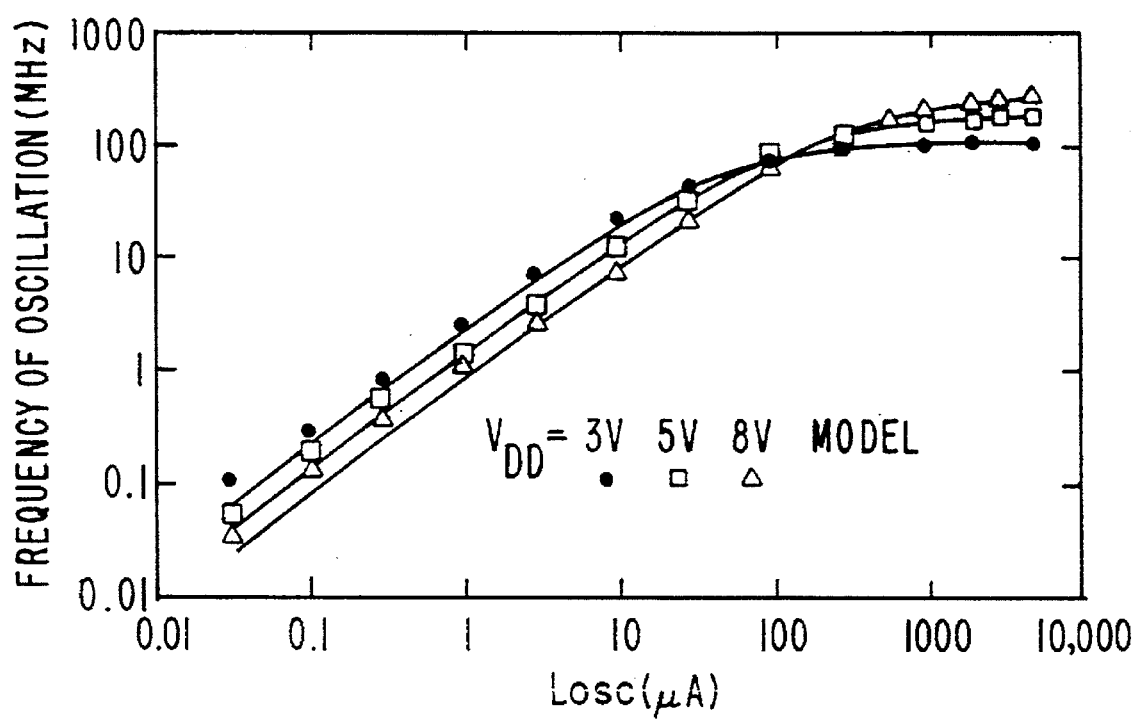
FIG. 2 is a graph showing oscillator frequency as a function of control current for three different values of $V_{DD}$.

The oscillator shown in FIG. 1 was built in a 1 μm (effective minimum channel length) CMOS technology. FIG. 2 shows the experimental dependence of the frequency on DC current. The oscillator operates reliably from 100 kHz to over 250 MHz with $V_{DD}$ from 3 to 8 V to provide a wide range of frequencies and accelerated stress voltages for HF reliability testing. Equation 2 is also graphed in FIG. 2 as solid lines to illustrate excellent agreement with the data. The value of $C_N$ was calculated using analytical approximations based on device geometry. This includes capacitance contributions of the gate-substrate oxide, gate-drain overlap, gate-source overlap and drain/source junctions. $\tau_p$ was determined from experimental measurements. For low $I_{osc}$ values (<100 μA), the model accurately predicts an increase in frequency with decrease in $V_{DD}$. For larger $I_{osc}$, the frequency increases with $V_{DD}$ since $\tau_p$ is inversely proportional to $V_{DD}$. The transition between the two regions occurs at about 90 MHz.

Since $I_0=I_1$ in this oscillator, $\tau_{p0}$ equals $\tau_{p1}$. As a result, the oscillator duty cycle (percent of time the waveform at CLK is a logic "1") was ≈50% for frequencies below 90 MHz. Maintenance of the 50% duty cycle for frequencies above 90 MHz was accomplished by symmetrically designed inverters with equal rise and fall times. The duty cycle can be varied by independent current mirrors to control $I_0$ and $I_1$. This variation is useful for examination of duty cycle effects in electromigration or oxide breakdown. Based on (1), the duty cycle varies from below 1% to above 99%. However, there is an inherent tradeoff between the frequency and calculated duty cycle. A large duty cycle is obtained at the expense of reduced frequency. For frequencies below 55 MHz, the duty cycle varies from 10% to 90%. For frequencies below 5.5 MHz, the duty cycle range increases to 1% through 99%.

Figure 3:
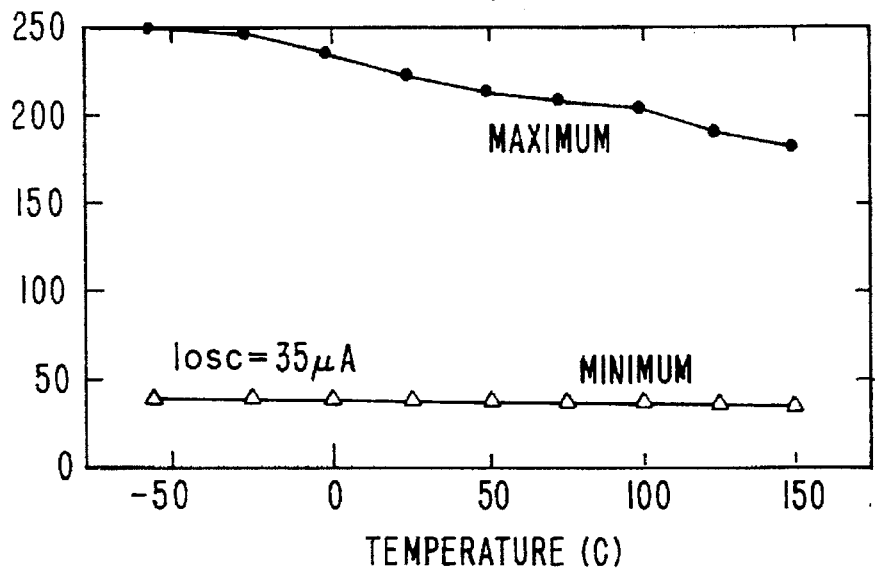
FIG. 3 is a graph showing the variation of the oscillator frequency as a function of temperature.

Since temperature is a key reliability acceleration parameter, the oscillator must also function over a wide temperature range. FIG. 3 shows the oscillator produces frequencies of 100 kHz to 180 MHz from −55° C. to 150° C. The maximum frequency at 150° C. is 180 MHz and increases as the temperature decreases (at −55° C. it is 250

MHz). This variation results from the change in transistor mobility and threshold voltage (in the inverters) with temperature. The figure also shows the frequency variation at a constant $I_{osc}$ of 35 µA. The small variation (less than 10%) from −55° C. to 150° C. can be compensated by varying $I_{osc}$.

All measurements of the DC-controlled oscillator and the reliability test structures were performed with DC test systems. The measurements at wafer-level were performed using an HP4062 parametric test system with a DC probe card. The cross-talk and noise on any pin of the DC probe card was less than 70 mV. HF probe cards reduced the noise, but were not necessary. The only special precaution was the addition of a small capacitor (0.1 µF) across the drain-to-source pins of Nosc on the probe card to bypass AC noise to ground. This ensures that only a DC signal sets the oscillator frequency. Stresses were also performed using a DC packaged-part test system at temperatures from −65° C. to 190° C.

Temperature Sensor and Heater

Figure 4A:
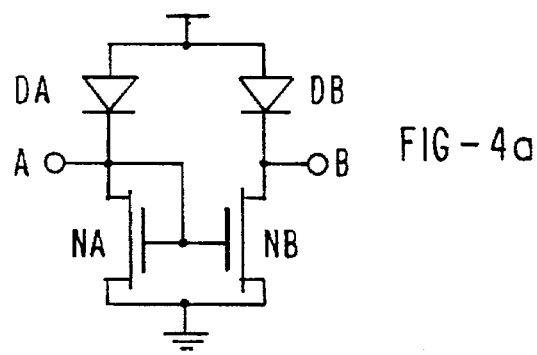
FIG. 4a is a schematic diagram of a temperature sensing element.
Figure 4B:
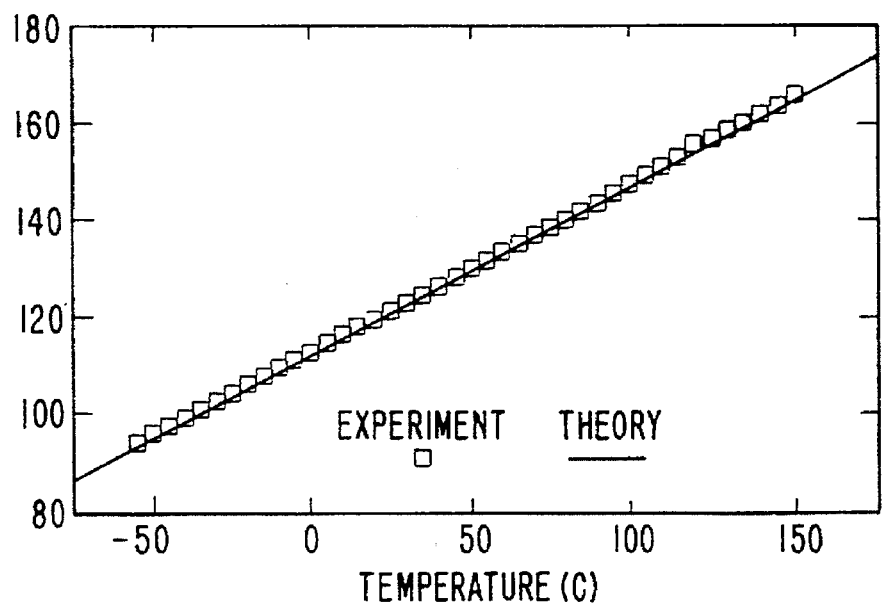
FIG. 4b is a graph showing the voltage output of the element of FIG. 4a as a function of temperature.

A differential temperature sensor and poly-silicon heaters were added to the test structures. The temperature sensor monitors the temperature of the die on the wafer and in packages. FIG. 4a depicts a schematic diagram of the temperature sensor. FIG. 4b gives the characteristic curves. The temperature is linearly proportional to the differential voltage between nodes A and B. A linear response with temperature is seen from −55° C. to 150° C. A first-order analytical model based on ratio of diode and transistor areas shows excellent agreement with the measured data.

Unlike the conventional diode temperature sensors, this structure does not need to be calibrated before each measurement. The calibration of the sensor is only necessary once for a given technology. Temperature measurement may also be made by using a metal line as a thermometer.

The test structures include poly-silicon heaters to increase the on-chip temperature. Because only the test structure is heated (not the entire wafer as when using a hot chuck), slipping of probes is insignificant. Measurement of the local chip temperature is provided by the temperature sensor or a metal line. The addition of the heaters provides a quick and easy method for evaluating high temperature, HF reliability with DC test equipment.

Hot-Carrier Degradation

Hot-carrier stresses were performed from 1 Hz to 230 MHz with a DC test system using self-stressing structures. For the 1 µm radiation-hardened CMOS process examined, we find that the AC hot-carrier-induced degradation can be predicted from DC measurements. In other words, the quasi-static model accurately describes the variation with frequency and operating voltage. Since deviations from this model have been reported for various technologies, this test structure provides a simple means to verify the model's validity for a particular technology. We were able to produce, for the first time, statistical variation in HF hot-carrier-induced degradation. This variation is important for accurate reliability simulation. Activation energy measurements were also performed at HF with these test structures. Both the variation and the activation energy determined from HF stresses were consistent with DC measurements.

A. DC Hot-Carrier Stress

Figure 5:
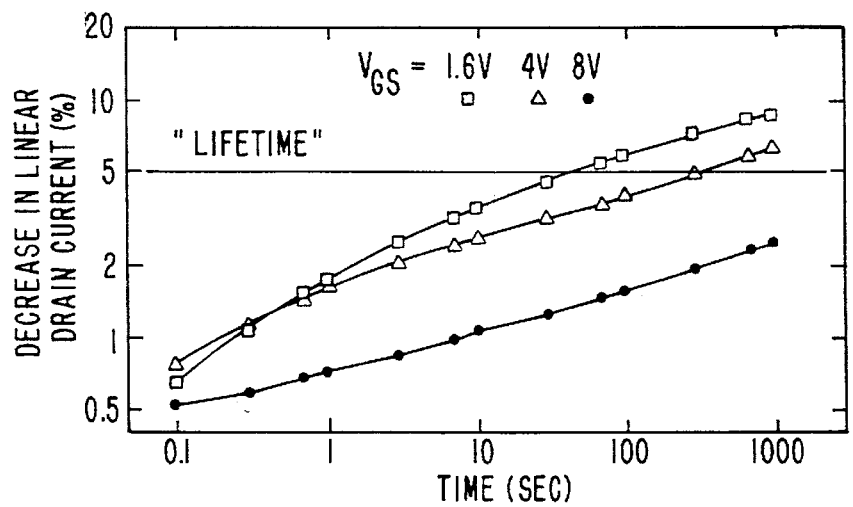
FIG. 5 is a graph showing hot carrier induced degradation as a function of time.

A series of DC stresses were performed on a 1 µm (effective channel length) n-channel MOSFETs with lightly-doped drains. The parameter which degraded most was the linear drain current ($I_{DSlin}$), while there was little change in the threshold voltage. $I_{DSlin}$ is defined as the current obtained with the gate-to-source voltage ($V_{DS}$) set to 50 mV. In this work, the "lifetime" due to a constant-voltage DC stress ($\tau_{DC}$) is defined as the time to 5% decrease in $I_{DSlin}$. FIG. 5 shows the average time evolution of degraded devices. Each data point represents the average of 5 stressed transistors. For this radiation-hardened technology, a stress where $V_{GS} \approx V_{DS}/5$ resulted in the most degradation (shortest $\tau_{DC}$). For the low-$V_{GS}$ DC stress, we found $\tau_{DC} = A \cdot \exp(B/V_{DC})$, where A and B are empirically determined constants.

B. Test Structure

Figure 6:
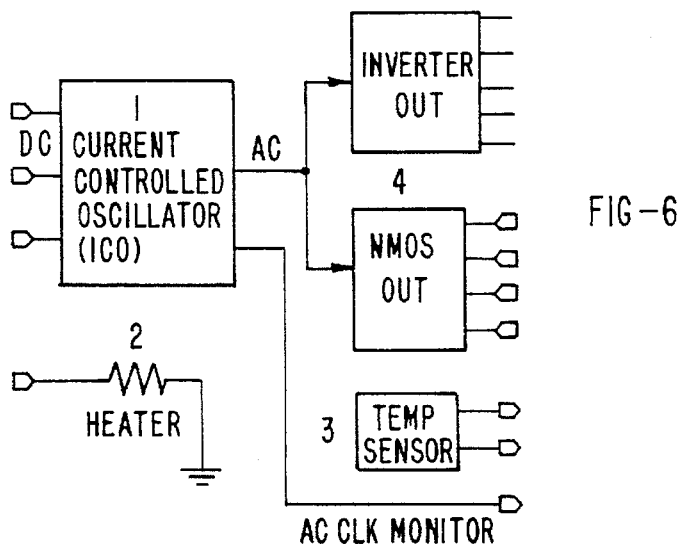
FIG. 6 is a schematic diagram showing a self-stressing HF hot carrier test structure system.

FIG. 6 shows a block diagram of the test structure used for HF hot-carrier-induced degradation. The test structure consists of an ICO that provides HF signals to stress an inverter and separate n-channel MOSFET. It also contains a poly-silicon heater and a temperature sensor. Other stress circuitry (e.g., NAND and NOR gates, pass transistors or differential amplifier) can easily be added. Since the structure (excluding the pads) is less than 100 µm wide, it could be placed in a scribe lane by rearranging the pad locations.

Figure 7A:
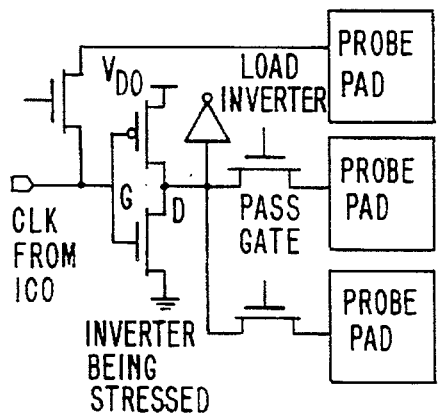
FIG. 7a is a simplified schematic diagram of the inverter of FIG. 6.
Figure 7B:
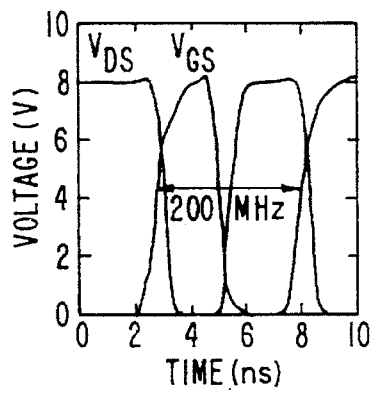

The test starts with measurement of the I-V characteristics of the transistors in the circuit elements. The circuit elements are then stressed at high frequencies for a preset time. The oscillator is turned off and the I-V characteristics of the transistors are remeasured. FIG. 7a shows a simplified schematic of the inverter test structure, and FIG. 7b shows the simulated stress voltage at the input and output of the inverter. The simulated rise and fall times are approximately 1 ns. An IDS5000 electron-beam test-system measurement confirmed this result. Pass transistors isolate the stressed circuitry from external pad capacitance which permits fast rise and fall times during stress. These pass transistors add little to the load capacitance compared with the load inverter in FIG. 7a. Different loads can be added to simulate worst-case design rules.

The pass transistors at the inverter output permit accurate measurement of the DC I-V characteristics of the inverter transistors. Current is forced through one pass gate while the other pass gate is used to sense the voltage at the inverter output. This configuration removes the resistance of the pass gate from the measurement.

C. Inverter Stress at High Frequency

Figure 8:
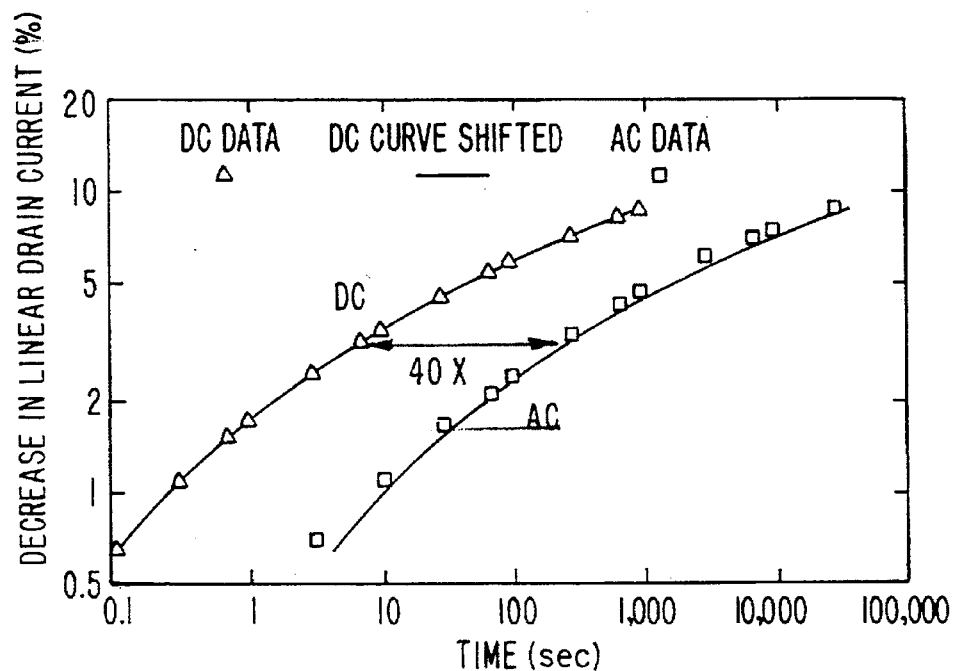

We used the test structure in FIG. 6 to perform a 145 MHz hot-carrier stress on the inverter with $V_{DD}=8$ V. At discrete times, this high-voltage, HF stress was removed and $I_{DSlin}$ of the 1 µm, n-channel device in the inverter was measured. FIG. 8 shows the time evolution of the HF-induced degradation. A worst-case DC stress (low-$V_{GS}$) is shown for comparison. Note that the same saturation behavior apparent at DC is also present in the AC result. Shifting the DC curve in time by a factor of 40 overlays the DC data on top of the AC data. This saturation behavior was not observed for mid-$V_{GS}$ ($V_{GS}=V_{DS}/2$) or high-$V_{GS}$ ($V_{GS}=V_{DS}$) DC stress. This implies that low-$V_{GS}$ stress conditions must dominate the n-channel AC degradation in the inverter. The qualitative agreement with the DC data also suggests that a quasi-static model should be applicable for this technology.

To investigate the quasi-static behavior further, we performed a series of AC stresses, with frequencies from 1 MHz to 200 MHz, at 8 V. The AC stress was run until $I_{DSlin}$ of the n-channel device decreased by 5%. The time to 5% decrease in $I_{DSlin}$ is defined as the AC "lifetime" ($\tau_{AC}$). The data from these tests show that $\tau_{AC}$ decreases as the stress frequency increases. The quasi-static model relates $\tau_{AC}$ to $\tau_{DC}$ by $$\frac{1}{\tau_{AC}} = f \cdot \int_0^T \frac{1}{\tau_{DC}} dt,$$

where T is the stress period (f=1/T). For a given stress waveform, the integral in (3) is constant and $\tau_{AC}$ should be inversely proportional to the frequency. Indeed, the data falls onto a straight line with a slope of −1. This indicates that the quasi-static model is appropriate.

Prediction of $\tau_{AC}$ requires evaluation of the integral in (3). Since $\tau_{DC}$ can be a complicated function of the stress waveform, this task is simplified by introduction of a damage time (teff). teff is the effective time the transistor is damaged per stress period at a given $V_{DD}$. $\tau_{DC}$ is determined at the same $V_{DD}$ (=$V_{DS}$) and worst-case $V_{GS}$. Since teff and $\tau_{DC}$ are constants at a given $V_{DD}$, (3) simplifies to $$\tau_{AC} = \frac{\tau_{DC}}{f \cdot teff}.$$

The quantity teff can be extracted from the data by noting that when $\tau_{AC}=\tau_{DC}$, teff=0.168 ns. teff will depend on the technology, inverter geometry, load and drive.

In order to estimate $\tau_{AC}$ at use condition, we characterized its variation with $V_{DD}$. A series of stresses at a constant frequency (150 MHz) and varying stress voltages ($V_{DD}$ from 6.5 to 8 V) were performed. Data from these tests showed that both AC and DC stress have the same voltage dependence. Since the AC stress frequency was 150 MHz, (4) gives $\tau_{AC}=\tau_{DC}\cdot 39.7$. The slope of the $\tau_{DC}$ curve was determined by fitting the DC data. This curve was shifted vertically by a factor of 39.7 to predict the AC results. Excellent agreement is send between this prediction and the data. Therefore, the AC results (at any voltage and frequency) can be predicted from the DC measurements.

D. N-channel Stress at High Frequency

Figure 9:
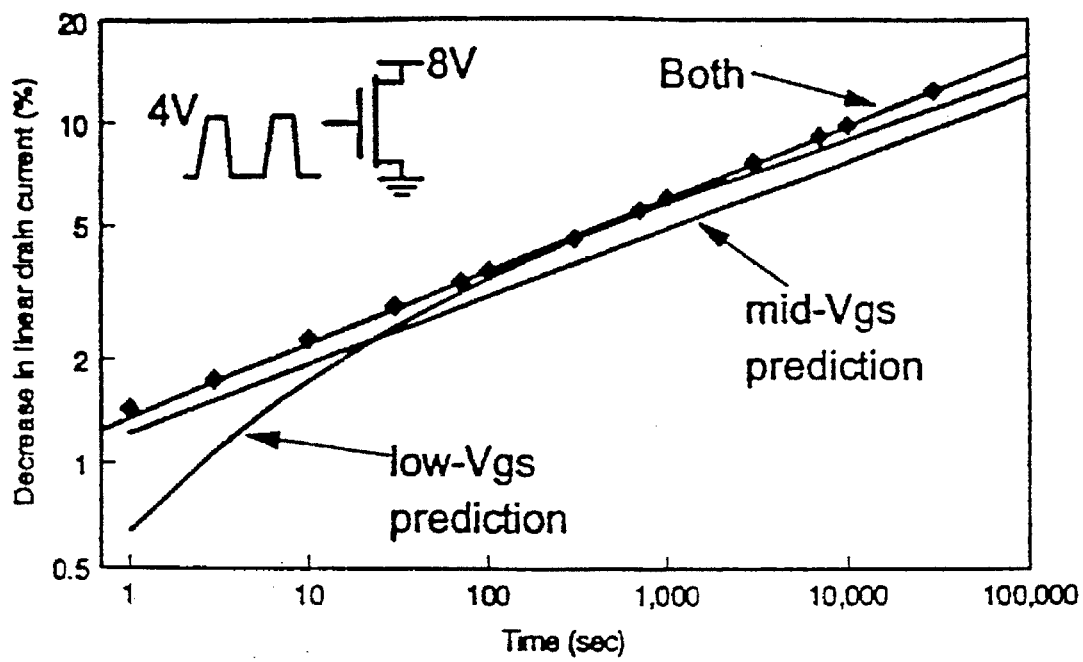
FIG. 9 is a graph showing the time evolution of HF-induced degradation in an N-channel MOSFET.

We also performed stress-testing on the separate n-channel transistor at 140 MHz. This was used to examine the combination of degradation mechanisms. Unlike the inverter stress, $V_{DS}$ of the n-channel device was held at 8 V with the ICO operated at $V_{DD}$=4 V. As a result, the transistor gate was stressed with pulses which varied from 0 to 4 V. Since the pulses had a duty cycle of 50%, this stress increased the contribution of the mid-$V_{GS}$ degradation (the point of maximum substrate current generation). The data from this stress is shown in FIG. 9. The data points are the average of 5 transistor stresses. The degradation does not have the strong saturation behavior observed in the inverter stress, which is consistent with the DC mid-$V_{GS}$ stress results. Using the DC stress results performed at mid-$V_{GS}$ only, the quasi-static model prediction is close to, but does not exactly match the measured AC stress degradation. Including the damage at the rising and falling edges of the $V_{GS}$ pulse (due to low-$V_{GS}$ damage) yields a result very close to the measured data. The damage at low-$V_{GS}$ and mid-$V_{GS}$ were combined using a Matthiessen-like rule as $$\frac{1}{\tau_{AC}} = \frac{1}{\tau_{AC(low-Vgs)}} + \frac{1}{\tau_{AC(mid-Vgs)}},$$

where $\tau_{AC(low-Vgs)}$ and $\tau_{AC(mid-Vgs)}$ are the "lifetimes" due to AC stress at low-$V_{GS}$ and mid-$V_{GS}$, respectively. The teff value for each stress region was determined from simulation of the $V_{GS}$ waveform. Note that (5) is a straightforward extension of (3).

E. High Frequency Statistical Variation

Scatter in DC-stress "lifetimes" (at a given $V_{DD}$) is not unusual. The statistical variation in $\tau_{DC}$ has been described by a log-normal distribution for thousands of transistors. This is significant since the "average" transistor "lifetime" can be an order of magnitude larger than the 100,000th transistor in an IC. In this work, we present the statistical distribution of "lifetimes" for inverters stressed at HF.

Figure 10:
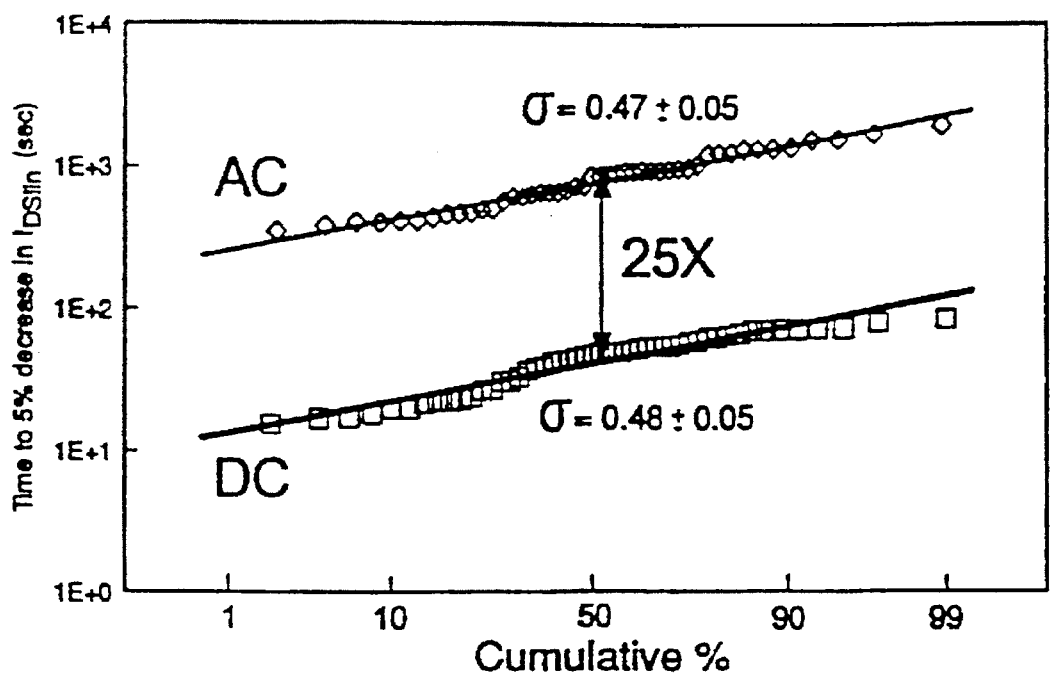

Fifty inverter-based self-stressing test structures distributed equally across a wafer were tested at 8 V and 230 MHz. The AC-stress "lifetimes" of the n-channel transistors (in the inverters) is plotted in FIG. 10. The variation in $\tau_{AC}$ is well described by the log-normal distribution. A DC stress at 8 V was performed on 50 n-channel devices ($V_{GS}=V_{DS}/5$). The distribution of $\tau_{DC}$ in FIG. 10 has the same log-normal $\sigma$ (slope) as $\tau_{AC}$. Consistent with the quasi-static analysis above, the median value of the AC curve is about 25 times larger than the DC curve. This result indicates that simple, highly-accelerated, DC stresses can be used to estimate the distribution of HF hot-carrier-induced degradation. This permits quick determination of critical statistical information for use in realistic reliability simulators.

F. Variation with Temperature

The variation in HF hot-carrier-induced degradation with temperature was examined using the self-stressing test structures. Test structures from one wafer were mounted in 24 pin ceramic packages. These were tested with a DC packaged-part test system with a temperature capability of −70° C. to 200° C. Although only designed for DC signals, the noise on critical pins was less than 70 mV.

Figure 11:
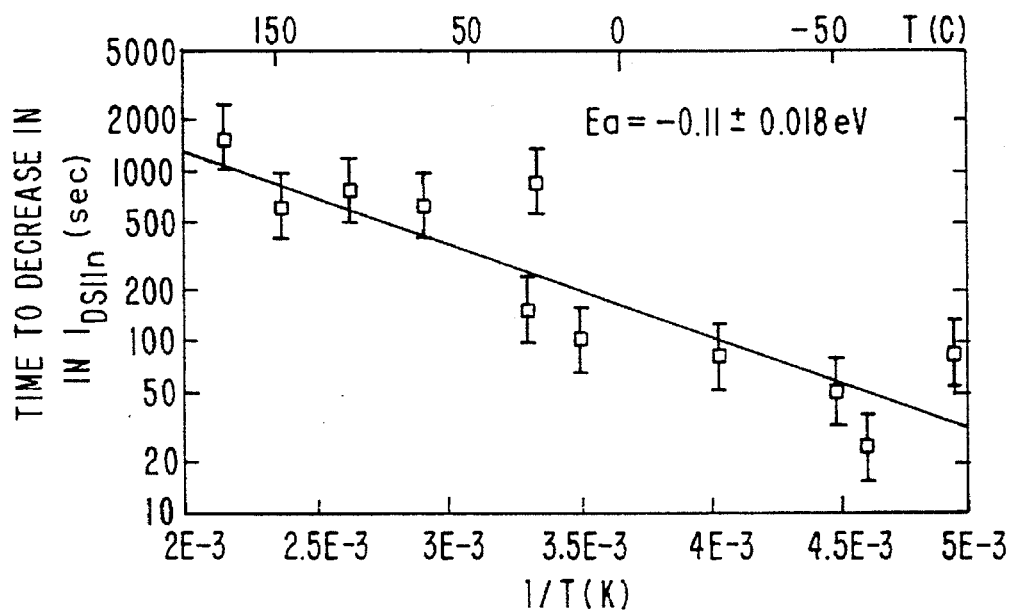

We stressed the test structures at 180 MHz and 8 V. The temperature of the tests varied from −65° C. to 190° C. From these tests, we determined the AC-stress "lifetime" of the n-channel transistors in the inverter. FIG. 11 shows and Arrhenius plot of $\tau_{AC}$. The error bars represent the standard error. The variation in this data is consistent with the observed variation in the "lifetimes" in FIG. 10. FIG. 11 yields an apparent activation energy of −0.11±0.018 eV. The activation energy agrees with previous DC studies within the experimental error.

Self-Stressing Test Structures for Electromigration

Figure 12:
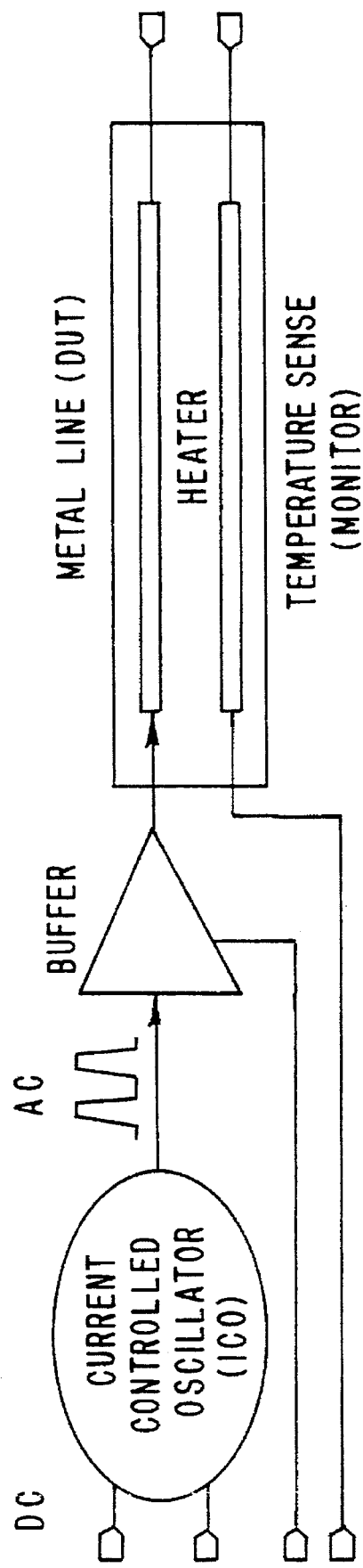
FIG. 12 is a schematic diagram showing a self stressing electromigration test structure system.

FIG. 12 shows a self-stressing electromigration test structure produced in a 0.8 μm CMOS process. The structure (excluding the pads) is less than 100 μm wide. This permits placement of the structure in a scribe lane. The structure consists of an ICO, which provides HF pulses to a metal line. It also contains a poly-silicon heater and a temperature sensor.

The electromigration (EM) circuit element is a long metal line (800 μm long) at minimum metal width (similar to the NIST EM test structure). Metal lines over topography, contact chains or SWEAT structures could also be used. The dominant acceleration parameters in EM are current density and temperature. The duty cycle of the HF signal and whether the pulses are bipolar or unipolar are significant factors. Therefore, the structure must provide a large amount of current, function at high temperatures and provide bipolar and unipolar current signals. A failure in the metal line must also be easily detected.

As described previously, an additional current mirror may be added to the ICO in FIG. 1 to permit duty cycle control.

The duty cycle of the oscillator is then varied by adjusting two DC control currents. One side of the metal line test structure connects to an external pad. By varying the DC voltage on this pad, both unipolar and bipolar stress currents can be applied.

Figure 13:
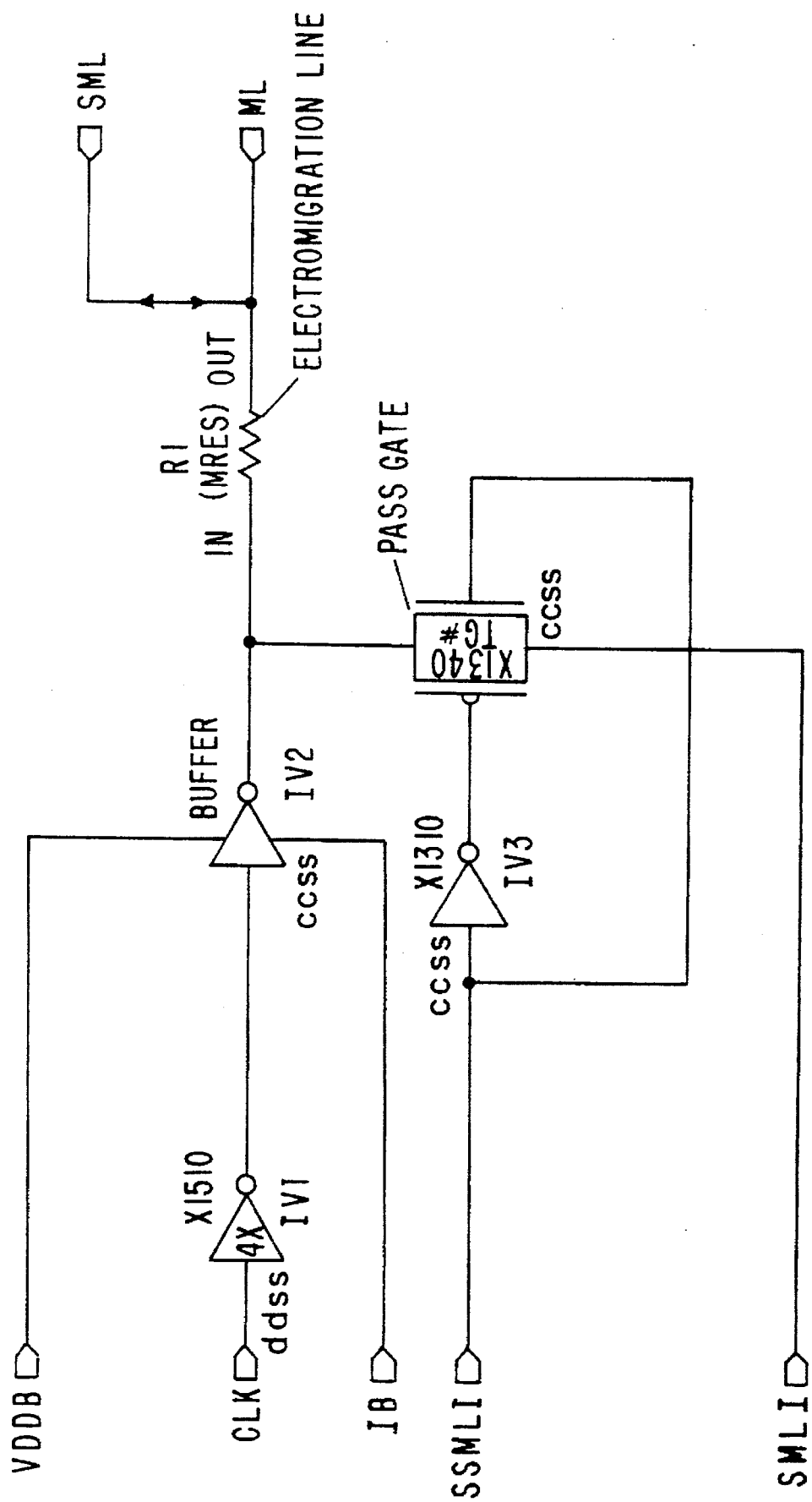
FIGS. 13 is a schematic diagram showing part of an electromigration test structure with a controllable high speed buffer.
Figure 14A:
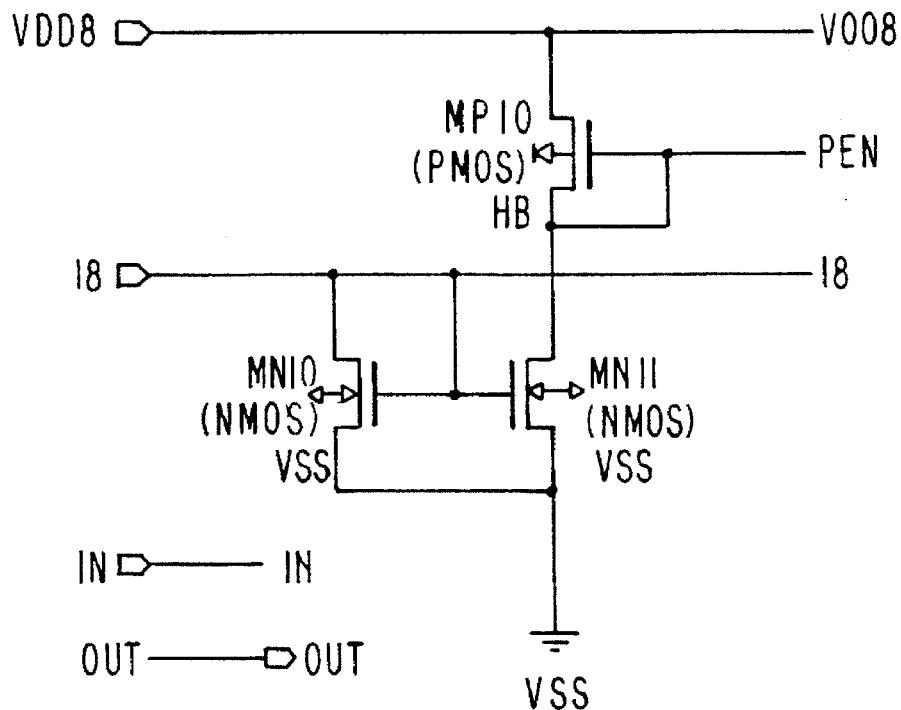
FIG. 14a is a schematic diagram showing the current mirror portion of the buffer in FIG. 13.
Figure 14B:
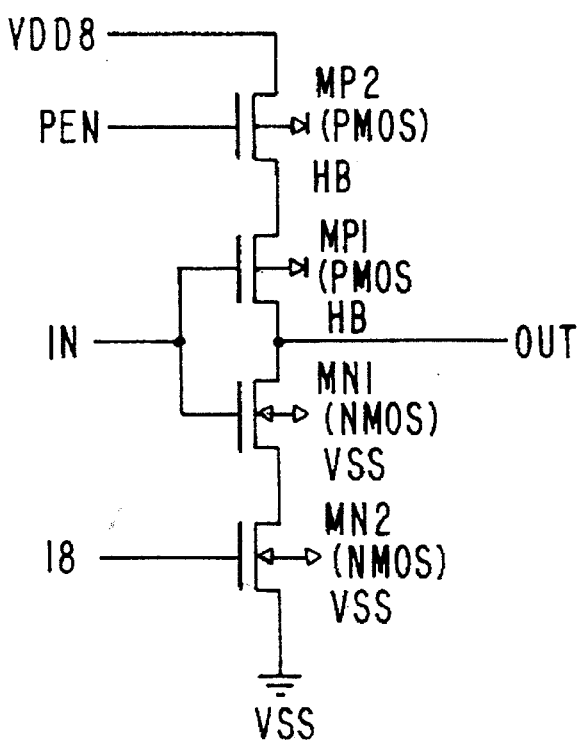
FIG. 14b is a schematic diagram showing the driver portion of the buffer of FIG. 13.
Figure 15:
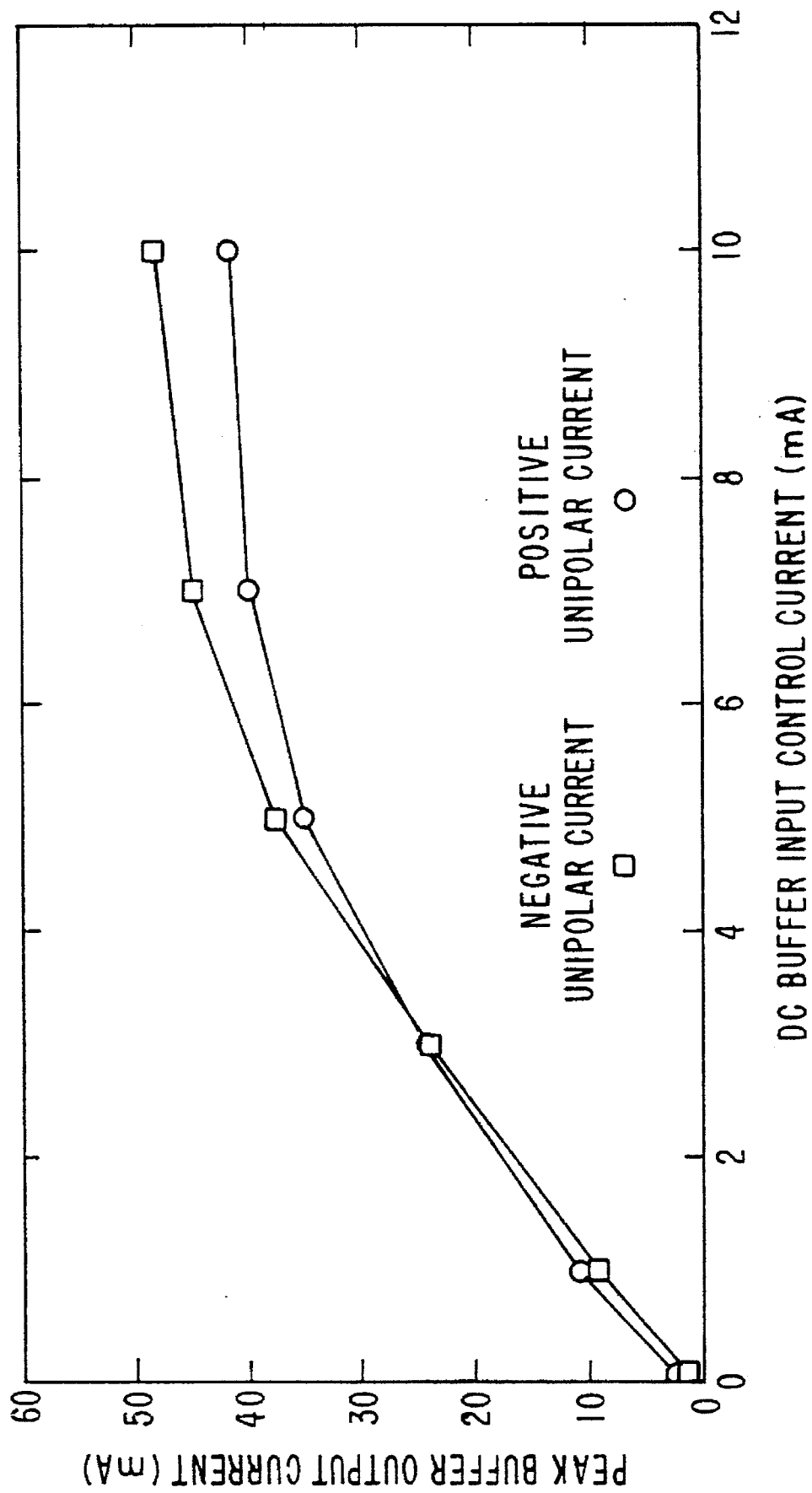
FIG. 15 is a graph showing the output of the buffer circuit of FIGS. 13 and 14 to DC input current.

A separate buffer stage is used to provide adjustable current pulses. FIG. 13 shows the buffer as part of the circuit used to stress and measure the electromigration line. The peak HF output current from the buffer is controlled by the DC input current IB. The pass gate (X1340) permits accurate measurement of the resistance of the metal line (electromigration line R1). During a stress, the pass gate isolates the large probe-pad capacitance from R1. This allows high frequency stress of R1. FIG. 14a and 14b shows the schematic of the buffer circuit. MN10, MN11 and MP10 form a current mirror circuit for the DC current IB. IB is translated to MP2 and MN2 which set the peak HF current in the metal line R1. MP1 and MN1 form an inverter which is turned on and off by the signals from the oscillator. The output of the inverter drives the metal line. In this way, the maximum amplitude of the HF current pulse is varied by changing a DC current (IB) applied to the buffer circuit as shown in FIG. 15.

Figure 16:
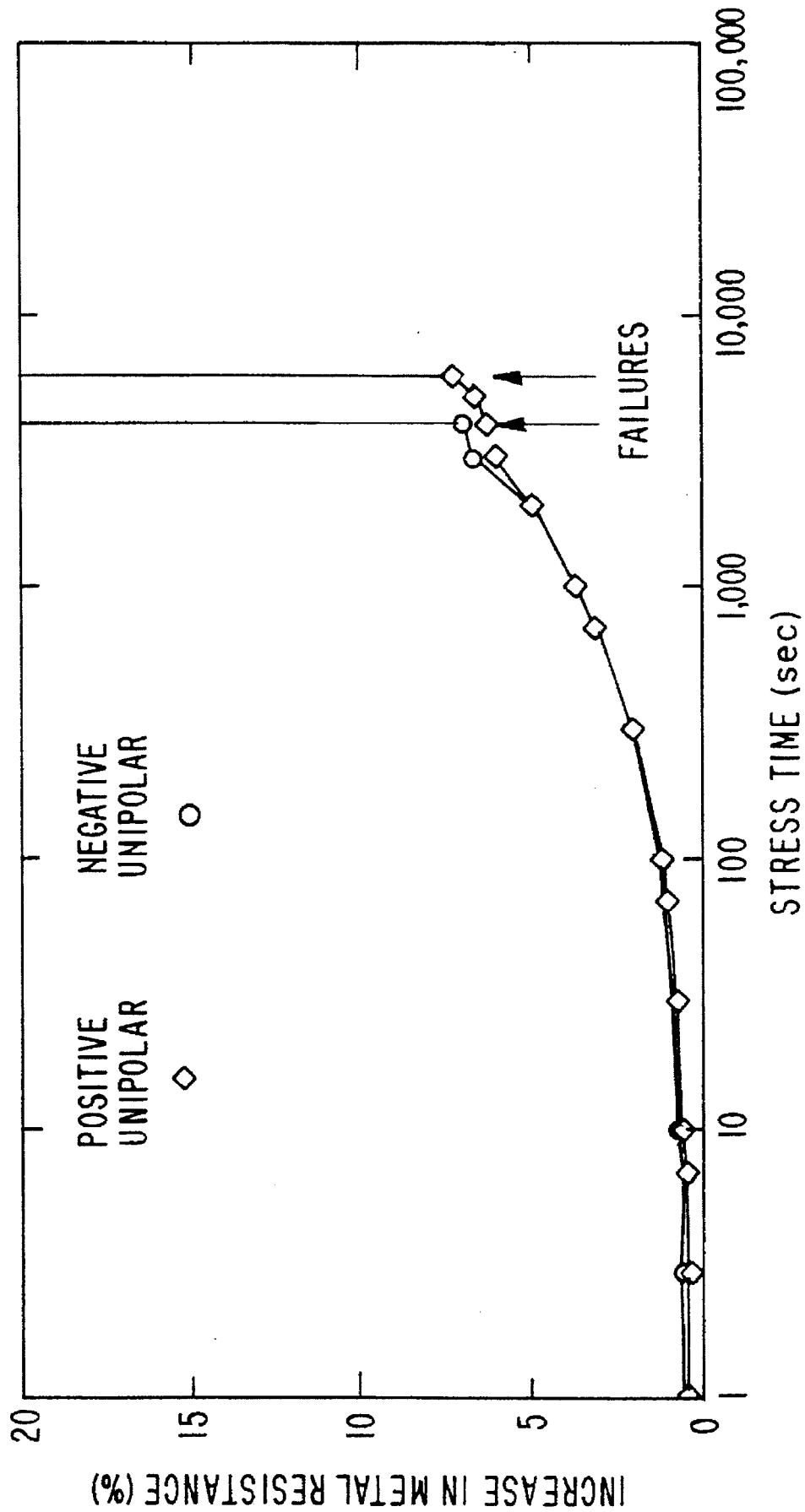
FIG. 16 is a graph showing the electromigration resistance time histories to 530 MHz unidirectional current pulses in a structure similar to that of FIG. 12.

To perform an EM test, the metal structure is stressed with HF current pulses. The temperature of the metal line during stress is raised by an on-chip heating element. Temperatures greater than 400° C. have been achieved. At discrete times, the stress is removed and the resistance of the metal line measured to determine the failure time. When the stress is removed, the output of the buffer is set to "high" or "low." Once the state is set, the voltage on the metal is varied around $V_{DD}$ or $V_{SS}$. The current measured at the various voltages is used to calculate the resistance. The resolution of this technique is increased by adding a controllable pass transistor (as a voltage tap) at the output of the buffer as shown in FIG. 13. FIG. 16 shows the results of an electromigration test performed at 530 MHz using the test structure.

Self-Stressing Test Structure for Oxide Breakdown

An oxide breakdown test structure includes a high frequency oscillator connected to a capacitor. The capacitor is made from a transistor with the source, drain and substrate connected together. Since the capacitor area is small, it will be an unusual event to encounter a defect. Therefore, an electric field great than 9 MV/cm is required to breakdown the dielectric in a reasonable length of time. For a 200 Å gate oxide, this requires that 18 V to be applied across the capacitor. Unfortunately, conventional CMOS circuits will not operate above 10 V, due to diode breakdown, punch through or latch-up. To overcome this limitation the gate of the capacitor is connected, via an external pad, to the maximum voltage to be used for stress ($V_{MAX}$). Since the time-to-failure is proportional to the exponential of applied voltage, the failure time will be dominated by the time at or near $V_{MAX}$. This structure trades-off the ability to switch completely to 0 V for the ability to apply very high frequency (>200 MHz) waveforms to determine frequency dependent phenomena, if any, for oxide breakdown.

To perform an oxide breakdown test, a HF signal is applied to the capacitor and removed at discrete times for measurement. DC leakage current through the structure is used to determine the failure time.

Alternative HF Oscillators

Figure 17:
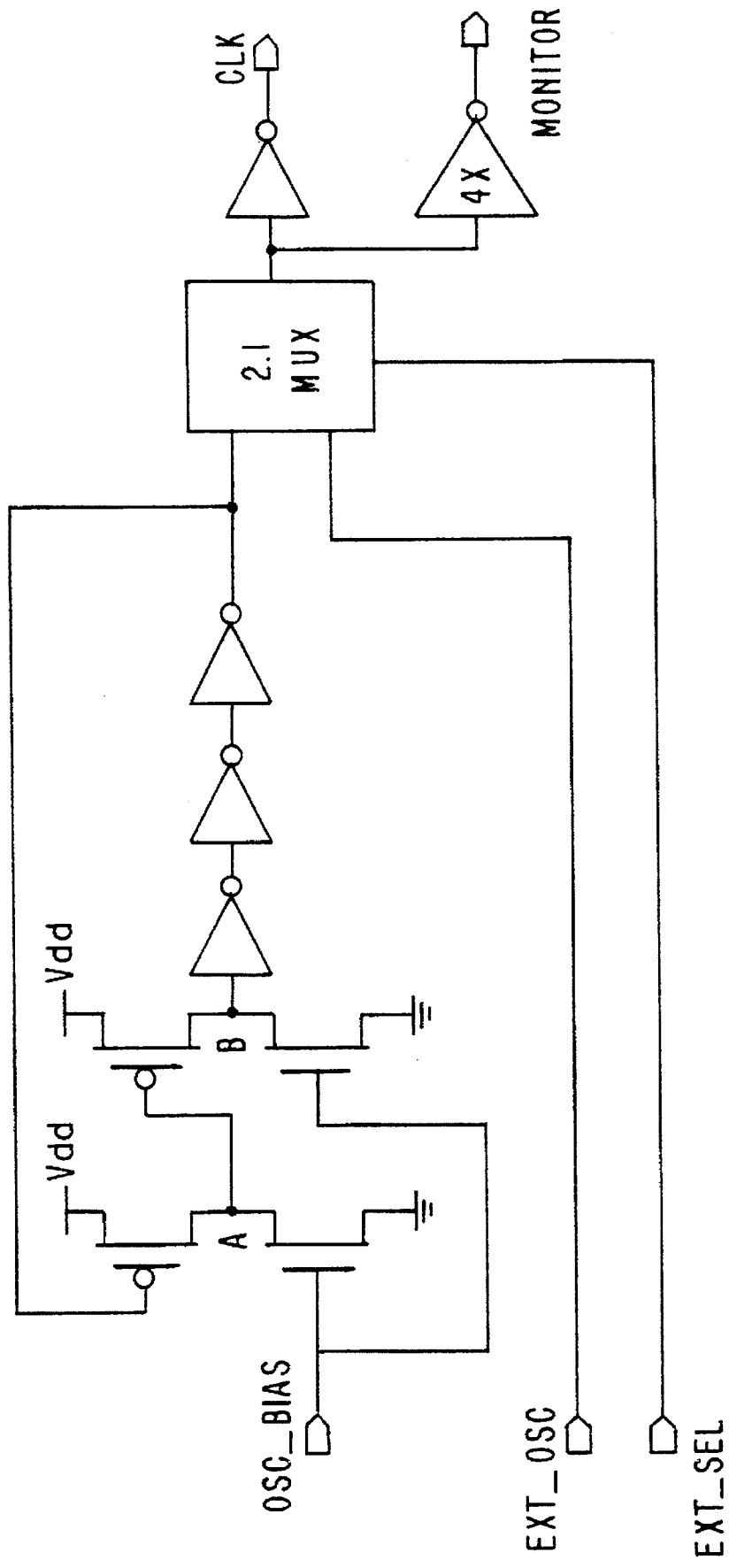
FIG. 17 is a schematic diagram of a voltage controlled oscillator.

As was mentioned above, a number of different designs for the oscillator are possible. FIG. 17 shows a simple DC voltage controlled oscillator useful at frequencies in the range of 1 to 100 MHz. This VCO has two gain stages that are followed by three inverters. The output of the last inverter feeds back to the input of the gain stage. Unlike a conventional ring oscillator, the frequency of this VCO is controlled by varying the input voltage on OSC_BIAS which controls the current flowing through the n-channel devices. These currents control the discharge of node A and B and hence the oscillator frequency. The n-channel devices have a width (W) to length (L) ratio that is nine times smaller than the W/L ratio of the p-channel devices. As a result, the p-channel devices can quickly pull-up the nodes A and B, compared with the ability of the n-channel device to pull-down the node. With a 0 at the first p-channel device, the p-channel quickly pulls node A to a 1. The second p-channel device is then off. Node B is pulled-down by the n-channel transistor. The discharge rate is controlled by the current set by the voltage OSC_BIAS. With a 0 at node A, the second p-channel device is on and node B is quickly pulled high. The clock output signal (CLK) is fed to the circuit elements to be stressed. A buffer stage is provided for monitoring the stress frequency. It is also useful to provide a parallel external AC voltage for stressing the circuits at lower frequencies than are efficiently handled by the HF oscillator via EXT_OSC. EXT_SEL operates as an ON/OFF switch as between the two sources for the CLK signal.

Figure 18:
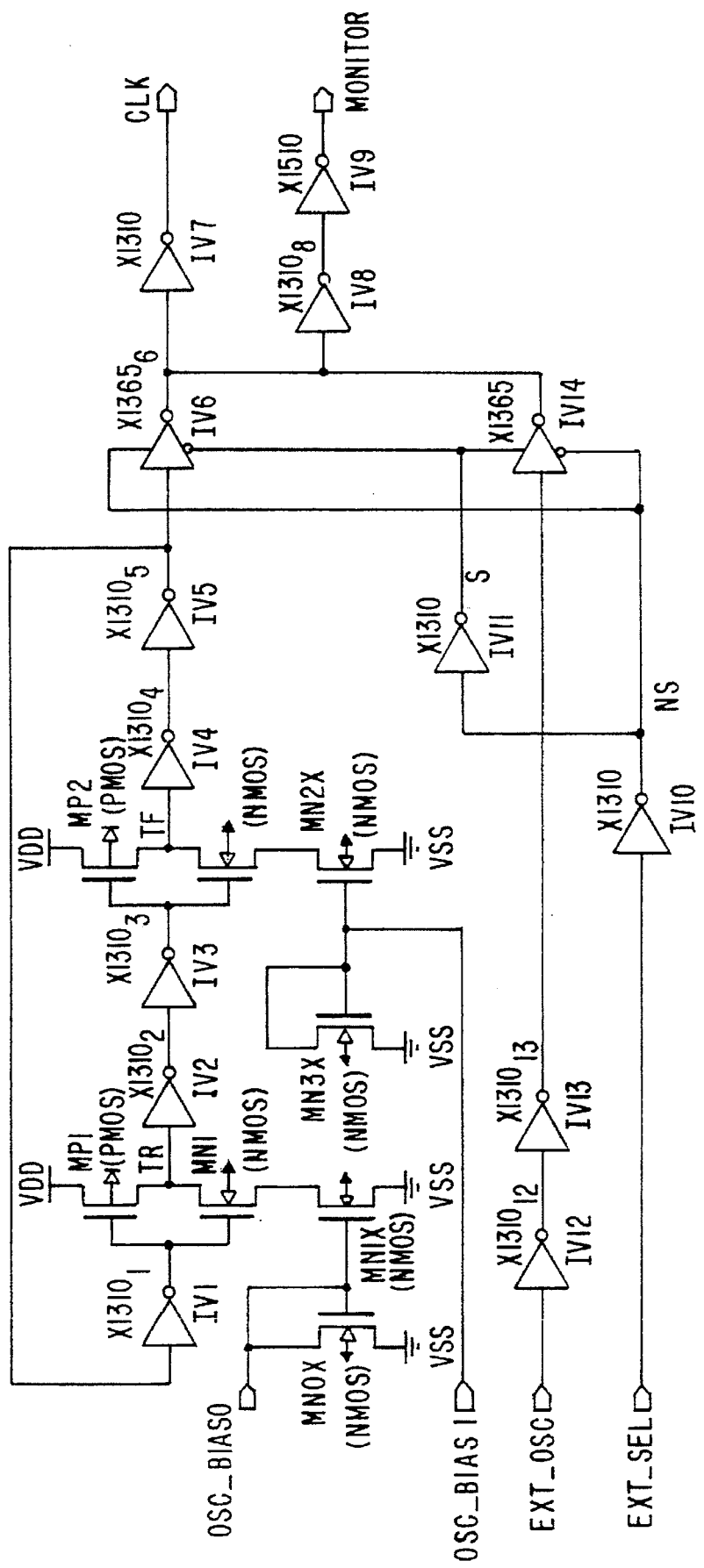
FIG. 18 is a schematic diagram of a current controlled oscillator capable of frequencies in excess of 500 MHz.

For extremely high frequencies (above 500 MHz), the oscillator shown in FIG. 18 was constructed in a 0.8 micron CMOS process. This oscillator is similar to the oscillator of FIG. 1 but further includes independent DC current controls OSC_BIAS0 and OSC_BIAS1 for the two current mirrors. This permits independent control of the duty cycle as previously described. Experiments show that the duty cycle can be varied from below 1% to above 99%. As with the oscillator of FIG. 13, a parallel external AC stressing signal EXT_OSC is provided, along with the EXT_SEL signal and the MONITOR output to measure the stressing frequency.

We claim:

1. An on-chip reliability and failure testing system comprising:

oscillator means for producing pulses at frequencies above about 100 kHz;

external DC control means for the oscillator to control the frequency and duty cycle of the pulses and measure the output of a test structure means: and test structure means driven by the pulses from the oscillator means, said test structure means comprising at least one discreet microelectronic element dedicated solely to the testing system each of which element being configured so as to uniquely express a failure mechanism as it would occur in other functional microelectronic circuits on the chip that are not connected to the elements of the test system located on the chip.

2. The system of claim 1 wherein the oscillator frequency is matched to the operating frequency of the chip.

3. The system of claim 1 further including on-chip heating means for the test structure means.

4. The system of claim 3 further including on-chip temperature sensing means for determining the temperature of the test structure means.

5. The system of claim 1 further including on-chip temperature sensing means for determining the temperature of the test structure means.

6. The system of claim 1 wherein the oscillator means is a voltage controlled oscillator.

7. The system of claim 1 wherein the oscillator means is a current controlled oscillator.

8. The system of claim 1 wherein the test structure means is adapted to test for hot carrier induced degradation.

9. The system of claim 8 wherein the test structure means comprises a device containing at least one MOS transistor.

10. The system of claim 8 wherein the test structure means comprises a device containing at least one bipolar transistor.

11. The system of claim 1 wherein the test structure means is adapted to test for electromigration.

12. The system of claim 11 wherein the test structure means comprises a metal line.

13. The system of claim 1 wherein the test structure means is adapted to test for oxide breakdown.

14. The system of claim 13 wherein the test structure means is a capacitor.

15. The system of claim 1 further comprising means to buffer and control the pulses to the test structure means.

16. The system of claim 1 wherein said external DC control means comprises means to terminate the application of pulses to the test structure means and means to measure the parameters of the test structure means in a state where they are not receiving pulses from the oscillator means.

17. An on-chip testing system comprising:

oscillator means for producing pulses at frequencies above about 100 kHz;

external DC control means for the oscillator to control the frequency of the pulses;

test structure means driven by the pulses from the oscillator means;

means to buffer and control the pulses to the test structure means;

heating means for the test structure means; and temperature sensing means for determining the temperature of the test structure means and wherein said buffer means, temperature means and test structure means are connected to said external DC control means.

18. The system of claim 17 wherein the oscillator means is a voltage controlled oscillator.

19. The system of claim 17 wherein the oscillator means is a current controlled oscillator.

20. The system of claim 17 wherein said external DC control means comprises means to terminate the application of pulses to the test structure means and means to measure the parameters of the test structure means in a state where they are not receiving pulses from the oscillator means.

21. The system of claim 17 wherein the test structure means comprise at least two separate test structures stressed in parallel.

22. The system of claim 21 wherein the test structure means are selected from the group consisting of hot carrier test structures, electromigration test structures, oxide integrity test structures, and combinations thereof.

* * * * *